United States Patent
Morton et al.

(10) Patent No.: US 6,710,518 B2
(45) Date of Patent: Mar. 23, 2004

(54) MANUALLY OPERABLE ELECTRONIC APPARATUS

(75) Inventors: Bruce McKay Morton, Snohomish, WA (US); Thomas James Rollins, Boynton Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 3 days.

(21) Appl. No.: 10/160,589

(22) Filed: May 31, 2002

(65) Prior Publication Data

US 2003/0222536 A1 Dec. 4, 2003

(51) Int. Cl.[7] .............................................. H01L 41/09
(52) U.S. Cl. ........................................ 310/328; 310/317
(58) Field of Search ........................... 310/317, 328–330

(56) References Cited

U.S. PATENT DOCUMENTS

| | | | | | |
|---|---|---|---|---|---|
| 4,136,268 A | * | 1/1979 | Rose | ...................... | 200/17 R |
| 4,626,730 A | * | 12/1986 | Hubbard, Jr. | ............... | 310/326 |
| 4,652,805 A | * | 3/1987 | Kohn | ......................... | 318/628 |
| 4,761,582 A | | 8/1988 | McKee | ....................... | 310/322 |
| 4,853,580 A | * | 8/1989 | Sula | .......................... | 310/339 |
| 5,887,995 A | * | 3/1999 | Holehan | ................... | 400/479.1 |
| 5,945,772 A | * | 8/1999 | Macnak et al. | ............. | 310/326 |
| 5,982,304 A | * | 11/1999 | Selker et al. | .................. | 341/27 |
| 5,982,612 A | * | 11/1999 | Roylance | .................... | 361/680 |
| 5,988,902 A | * | 11/1999 | Holehan | .................. | 400/479.1 |
| 6,064,141 A | * | 5/2000 | Wiciel | ......................... | 310/339 |
| 6,078,126 A | * | 6/2000 | Rollins et al. | ............. | 310/330 |
| 6,359,371 B1 | * | 3/2002 | Perkins et al. | ............. | 310/328 |
| 6,366,202 B1 | * | 4/2002 | Rosenthal | .............. | 340/539.32 |
| 6,366,212 B1 | * | 4/2002 | Lemp | ...................... | 340/815.4 |
| 6,376,967 B2 | * | 4/2002 | Saarmaa et al. | ............ | 310/329 |
| 6,409,675 B1 | * | 6/2002 | Turcott | ....................... | 600/508 |
| 6,534,732 B2 | * | 3/2003 | Karasik et al. | ........... | 200/61.54 |
| 6,563,254 B2 | * | 5/2003 | Perkins et al. | ............. | 310/328 |

* cited by examiner

*Primary Examiner*—Thomas M. Dougherty
(74) *Attorney, Agent, or Firm*—Randi L. Dulaney; Lawrence J. Chapa

(57) ABSTRACT

An electronic device such a telephone (100), PDA (600), or pager (800), includes a manually operable input such as an elastomeric key (102, 103) or button (814), or a touch screen (604) that does not by itself provide substantial tactile feedback upon actuation, and also includes an electromechanical transducer (212) that is capable of generating an impulse of mechanical energy that can be felt. In response to detecting actuation of the manually operable input (102, 103, 814, 604), the electromechanical transducer (212) is driven to produce an impulse of mechanical energy that propagates to the manually operable input (102, 103, 814, 604) and provides tactile feedback to a user.

17 Claims, 7 Drawing Sheets

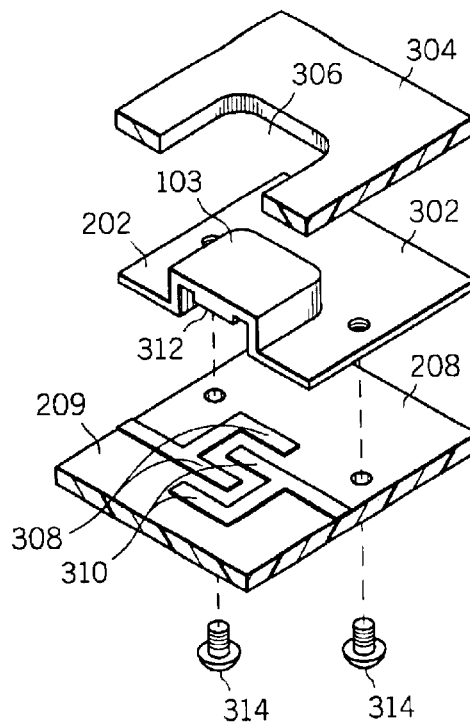
FIG. 3
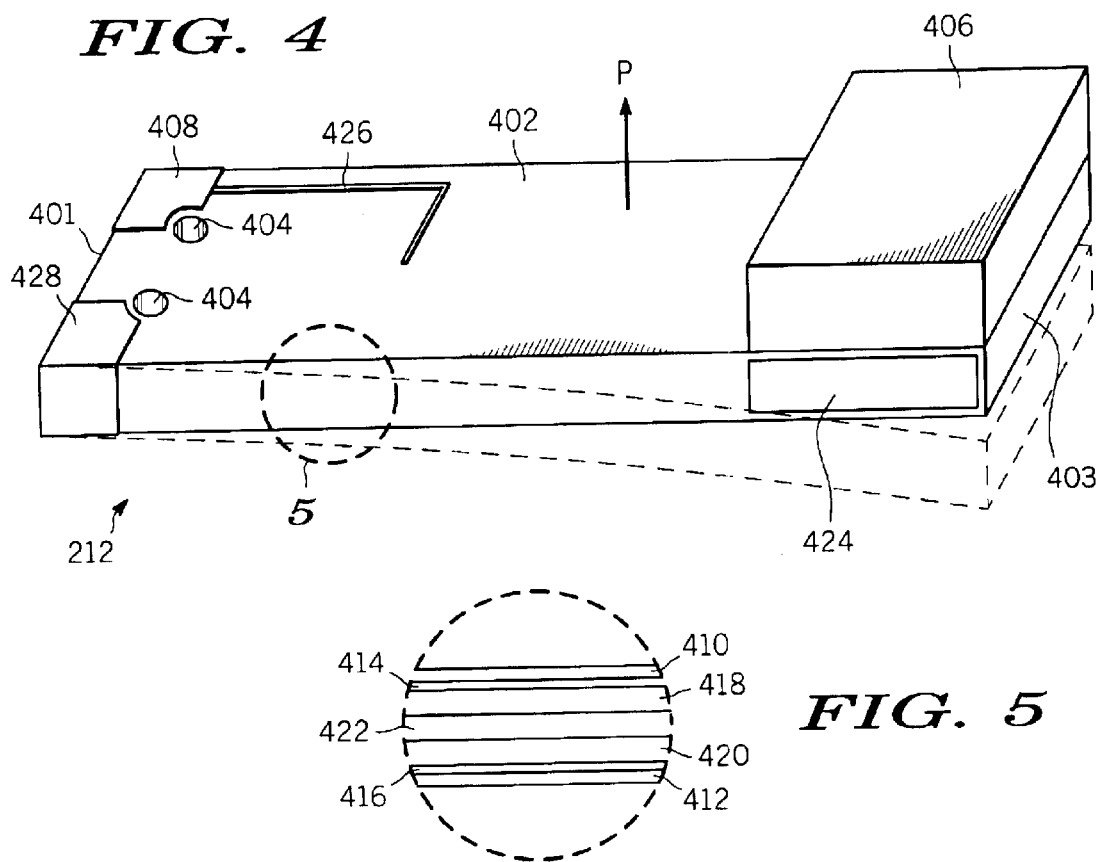
FIG. 4
FIG. 5

MANUALLY OPERABLE ELECTRONIC APPARATUS

BACKGROUND OF THE INVENTION

FIELD OF THE INVENTION

The invention relates to manually operable controls for electronic devices.

DESCRIPTION OF RELATED ART

In the past decade a variety of electronic devices, including portable electronic devices have come into wide spread use. In the design of electronic devices that are portable emphasis is placed on reducing the space occupied by each individual component, and reducing the cost. The former consideration leads to selection of buttons that have a small stroke (distance the button moves when actuated). Unfortunately, such buttons do not provide a great deal of tactile feedback to a user operating the buttons. This is particularly problematic if a user is in the habit of actuating a sequence of buttons in rapid succession, in the case of user having reduced manual dexterity (e.g., an elderly user), or in the case of a visually impaired user.

Dome switches which abruptly displace when a certain threshold manual actuation force is exceeded, have been used. Although such switches provide a degree of tactile feedback, they have complex structures, and commensurate cost. Elastomeric switches are a type of low cost, but also, low stroke switch. Regrettably, elastomeric switches provide little tactile feedback.

Given the rapid introduction of new types of device (e.g., Personal Digital Assistants, Text messaging pagers, MP3 players), and the rapid development of novel functionality, another important objective in designing electronic devices is to provide intuitive interfaces. Employing touch screens along with graphical user interfaces (GUI) is one avenue to providing intuitive interfaces. Unfortunately, the stroke of touch screens is frequently so small as to be imperceptible, and consequently touch screens provide little if any tactile feedback.

BRIEF DESCRIPTION OF THE DRAWINGS

The present invention will be described by way of exemplary embodiments, but not limitations, illustrated in the accompanying drawings in which like references denote similar elements, and in which:

FIG. 3 is an exploded cut away view of an elastomeric switch used in the wireless communication device shown in FIGS. 1, 2 according to the preferred embodiment of the invention.

FIG. 4 is a perspective view of an electromechanical transducer used in the wireless communication devices shown in FIGS. 1, 2, 6–9 according to the preferred embodiment of the invention.

FIG. 5 is a magnified portion of the electromechanical transducer shown in FIG. 4.

DETAILED DESCRIPTION OF THE PREFERRED EMBODIMENTS

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Figure 1:
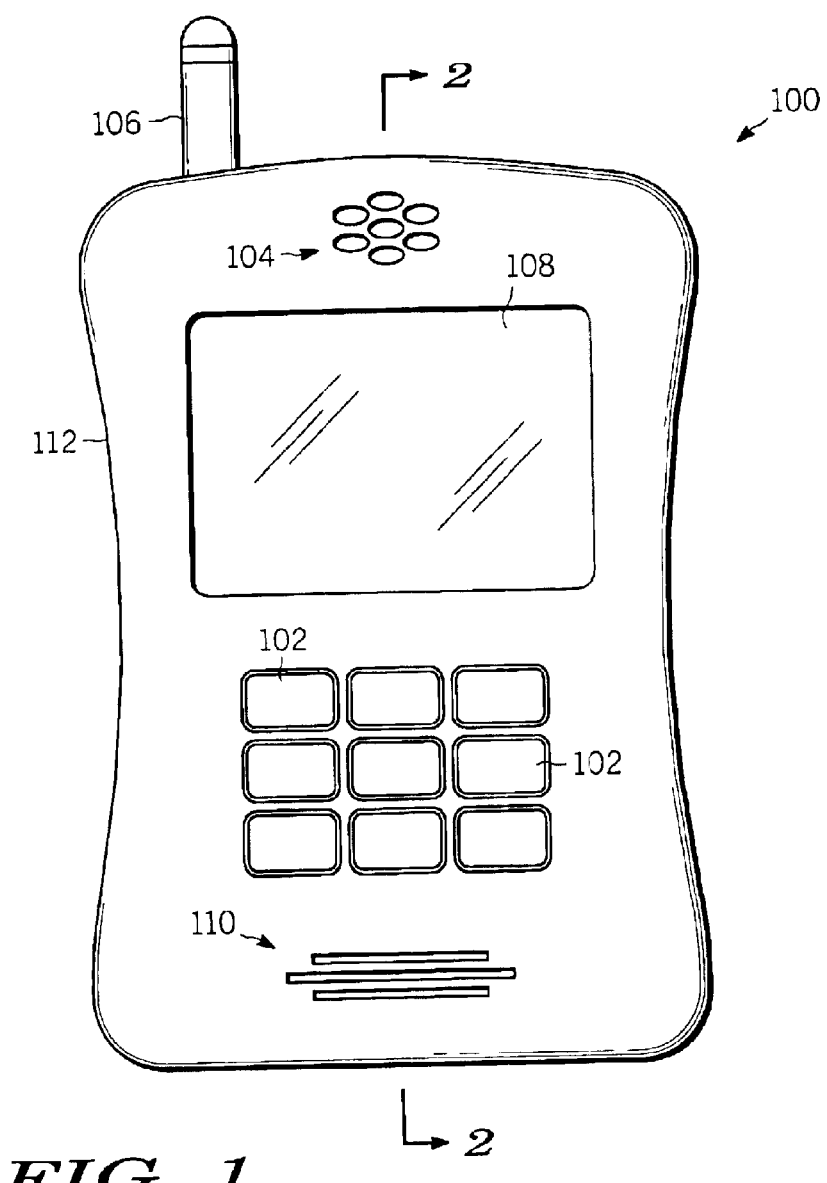
FIG. 1 is a front view of a wireless communication device according to the preferred embodiment of the invention.
Figure 2:
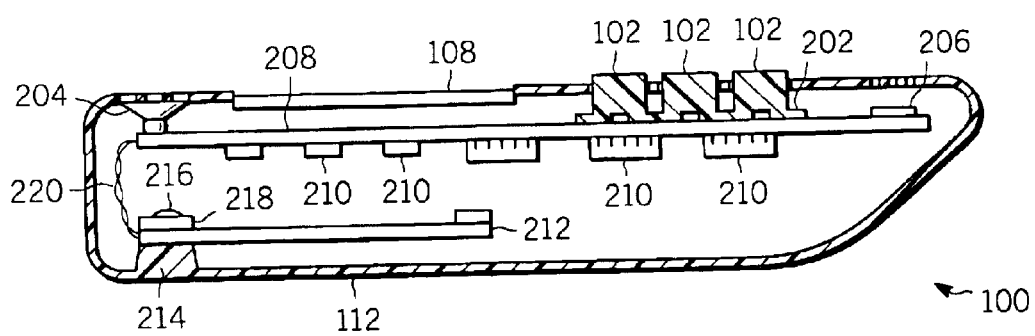
FIG. 2 is a sectional side view of the wireless communication device shown in FIG. 1.

FIG. 1 is a front view of a wireless communication device according to the preferred embodiment of the invention and FIG. 2 is a sectional side view of the wireless communication device shown in FIG. 1. As shown in FIGS. 1 and 2 the wireless communication device comprises a telephone 100. The telephone 100 includes a housing 112. The housing 112 includes an audio output grid 104, overlying a speaker 204. An antenna 106 is provided for receiving and transmitting RF communication signals. A display 108 is providing for displaying information, such as stored telephone numbers, and caller ID information to a user. An audio input aperture grid 110 is provided for coupling sound including a user's utterances to a microphone 206. The telephone 100 includes a circuit board 208 that supports and electrically couples circuit components 210 that make up one or more electrical circuits that are part of the telephone 100. The circuit board 208 also supports the speaker 204, and the microphone 206. The telephone 100 includes a number of keys 102 that are part of an elastomeric keypad 202. The elastomeric keypad 202 preferably comprises a unitary molded piece of elastomer that forms a plurality of keys and a matte that connects the plurality of keys. The keys 102 are quiet, i.e., they make little or no noise when actuated, have small strokes, e.g., less than one millimeter, and provide little tactile feedback. The keypad 202 is supported on the circuit board 208. The functioning of the keypad 202 is described in more detail below with reference to FIG. 3. The telephone 100 also includes an electromechanical transducer 212. The electromechanical transducer 212 is secured to a mounting boss 214 in the housing 112 by a clamping plate 218 and one or more screws 216. A twisted pair of leads 220 is used to electrically connect the circuit board 208 and the electromechanical transducer 212. The electromechanical transducer 212 is mechanically coupled to the keys 102 through the housing 112. The electromechanical transducer 212 serves to convert electrical signals to mechanical movement. The electromechanical transducer 212 is preferably fast enough to be able to generate a mechanical impulse that causes a mechanical disturbance of the housing that propagates to the keys 102. Such a mechanical impulse also causes a jolt of the entire telephone 100 that can be felt. The electromechanical transducer 212 is described in more detail below with reference to FIG. 4.

FIG. 3 is an exploded cut away view of an elastomeric switch used in the wireless communication device shown in FIGS. 1, 2 according to the preferred embodiment of the invention. Referring to FIG. 3 a portion of the keypad 202, including a single key 103 and a portion of a matte 302 that interconnects the keys 102 is shown. When the telephone 100 is assembled, the single key 103 protrudes through an opening 306, in a bezel portion 304 of the housing 112. The matte portion 302 of the keypad 202 is clamped between the bezel portion 304 of the housing 112, and the circuit board 208. A portion 209 of the circuit board 208 underlying the single key 102 includes a first set of metallization fingers 308, that are interdigitated with a second set of metallization fingers 310. The single key 103 (as other keys 102) includes a pad 312 on its lower inner surface. The pad 312 includes a conductive fill (e.g., carbon black, or metal particles) or is coated with a conductive film or ink. When the single key 102 is depressed, the pad 312 contacts the first and second set of metallization fingers 308, 310 thereby establishing an electrical connection between the two sets of metallization fingers 308, 310. The circuit board 208 is secured to the bezel portion 304 of the housing 112 using a number of screws 314 (two of which are shown).

FIG. 4 is a perspective view of the electromechanical transducer 212 according to the preferred embodiment of the invention and FIG. 5 is a magnified portion of the electromechanical transducer shown in FIG. 4. The transducer 212 includes a flat beam piezoelectric motor 402. A first end 401 of the flat beam 402 is provided with two through holes 404 that are used to mount the transducer 212 on the mounting boss 214. A mass 406 is supported at a second end 403 of the beam 402. The second end 403 of the beam 402 is free to move. A first electrical contact 408, and a second electrical contact 428 are located proximate the first end 401 of the beam 402. Leads 220 (not shown in FIG. 4) are soldered to the first and second contacts 408, 428.

The beam 402 includes a plurality of layers as will be described presently. A first outer mylar layer 410 forms one side of the beam 402, and a second outer mylar layer 412 forms an opposite side of the beam 402. A first silver film layer 414, and a second silver film layer 416 are located between the first and second mylar layers 410, 412. A first piezoelectric layer 418 and a second piezoelectric layer 420 are located between the first and second silver film layers 414, 416. A brass shim 422 is located between the first and second piezoelectric layers 418, 420. The recited layers are bonded together using heat cured epoxy. The recited layered structure preferable extends over a middle portion of the beam 402. The layered structure need not extend under the mass 406 or to the first end 403. A brass plate 424 is preferably located between the first and second outer mylar layers 410, 412 underneath the mass 406. The first and second piezoelectric layers 416, 418 are preferably polarized parallel to each other and perpendicular to the top and bottom major surfaces of the beam 402. An exemplary polarization direction is indicated by vector P. The first and second silver film layers 414, 416 are preferably electrically connected to the first electrical contact 408 by a first metallization trace 426, and a second metallization trace (not shown) that run between the outer mylar layers 410, 412 and the silver film layers 414, 416. The brass shim 422 is preferably electrically connected to the second electrical contact 428. The brass shim 422 along with the first and second silver film layers 410, 412 serve as planar electrodes for applying electric fields to the piezoelectric layers 418, 420.

If the first electrical contact 408 is coupled to a first pole of a DC signal source, and the second electrical contact 428 is connected to a second pole of the DC signal source, oppositely directed electric fields will be established in the first and second piezoelectric layers 418, 420. Such oppositely directed fields will induce one of the piezoelectric layers 418, 420 to expand, and the other of the piezoelectric layers 418, 420 to contract. The simultaneous expansion of one of the piezoelectric layers 418, 420 and contraction of the other of the piezoelectric layers 418, 420, will cause the beam 402 to bow, and the mass 406 to be displaced perpendicularly with respect to the length of the beam 402. A somewhat exaggerated depiction of the deflected beam 402, without the mass 402, is shown by shadow lines. If the polarity of the signal source coupled to the first and second electrical contacts 408, 428 is reversed, the beam 402 will deflect in an opposite sense.

Figure 6:
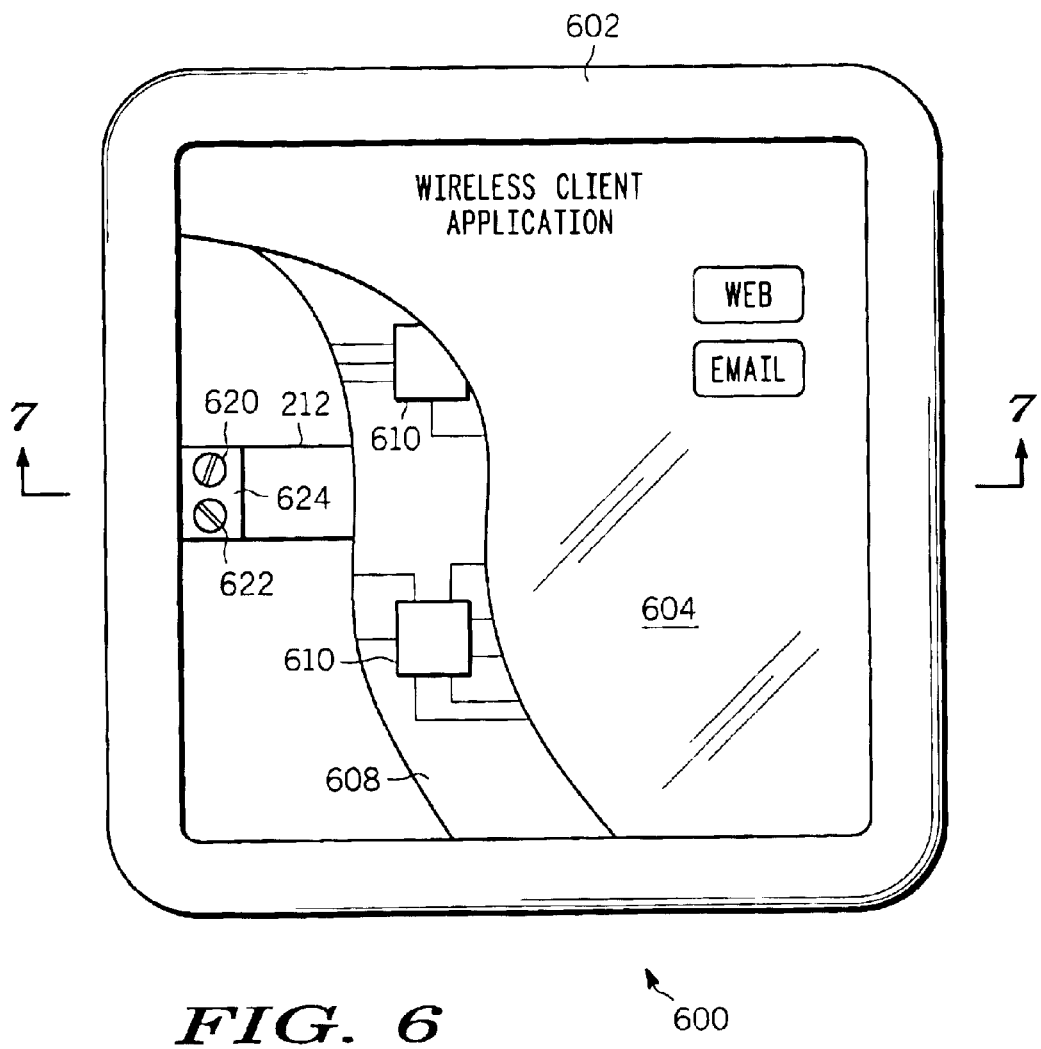
FIG. 6 is a front view of a wireless communication device according to a first alternative embodiment of the invention.
Figure 7:
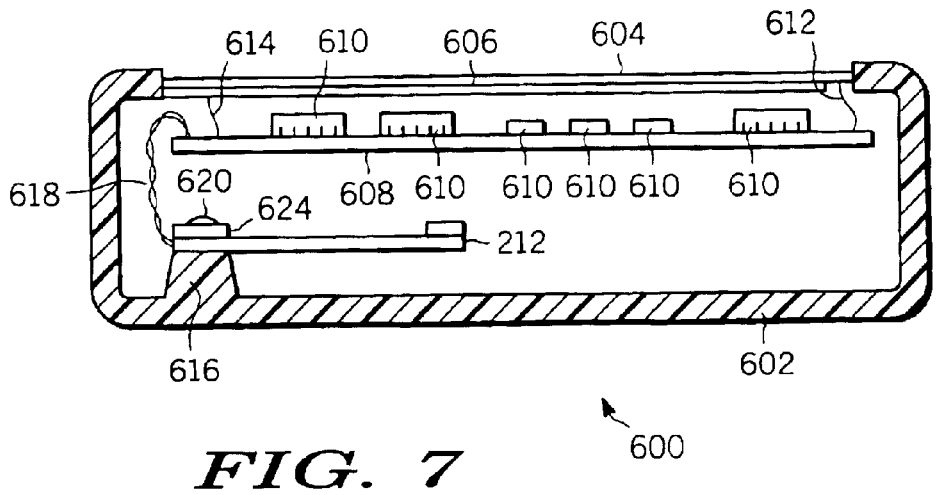
FIG. 7 is a sectional side view of the wireless communication device shown in FIG. 6.

FIG. 6 is a front view of a wireless communication device according to a first alternative embodiment of the invention and FIG. 7 is a sectional side view of the wireless communication device shown in FIG. 6. The wireless communication device shown in FIG. 6 comprises a wirelessly connected personal digital assistant (PDA) 600. The PDA 600 includes a housing 602 that supports a touch screen 604, over a flat panel display 606 (e.g., a liquid crystal display). A printed circuit board 608 is enclosed within the housing 602. The circuit board 608 supports and electrically couples a plurality of electric circuit components 610. A first electrical coupling 612 connects circuits on the printed circuit board 608 to the touch screen 604, and a second electrical coupling 614 connects circuits on the printed circuit board 608 to the display 606.

The electromechanical transducer 212 is also mounted on a mounting boss 616 of the housing 602 of the PDA 600. Two screws 620, 622 and a clamping plate 624 are used to clamp the electromechanical transducer 212 to the mounting boss 616. A twisted pair of leads 618 connects the electromechanical transducer 212 to circuits on the printed circuit board 608. The touch screen 604 is mechanically coupled to the electromechanical transducer 212 through the housing 602, thus allowing mechanical energy impulses generated by the electromechanical transducer 212 to reach the touch screen 604.

In the state shown in FIG. 6, two virtual buttons labeled 'Web' and 'Email' are presented on the display 606. When a user presses directly, or with a stylus, on a portion of the touch screen 604 overlying one of the virtual buttons, the press will be detected and in response thereto the electromechanical transducer 212 will be driven causing the electromechanical transducer 212 to emit mechanical energy that is coupled to the touch screen (and through the stylus if used). The mechanical energy is felt by the user as one or more impulses. The impulse(s) serve to confirm to the user that the intended input has been registered by the PDA 600. In other words, the user receives acknowledgement of the intended input. The electromechanical transducer 212 is preferably driven with a signal that includes one or more sharp steps, so that at the same time that an impulse that leads to tactile feedback is emitted, an audible click like sound is also emitted by the electromechanical transducer 212. Driving the electromechanical transducer 212 with a signal that includes one or more sharp steps causes the PDA 600 to be jolted. If the PDA 600 were being supported by the user, an overall displacement of the PDA 600 associated with the jolt would also be felt. The electromechanical transducer 212 in the PDA 600 can also be driven with audio in order to play music or emit voice audio.

Figure 8:
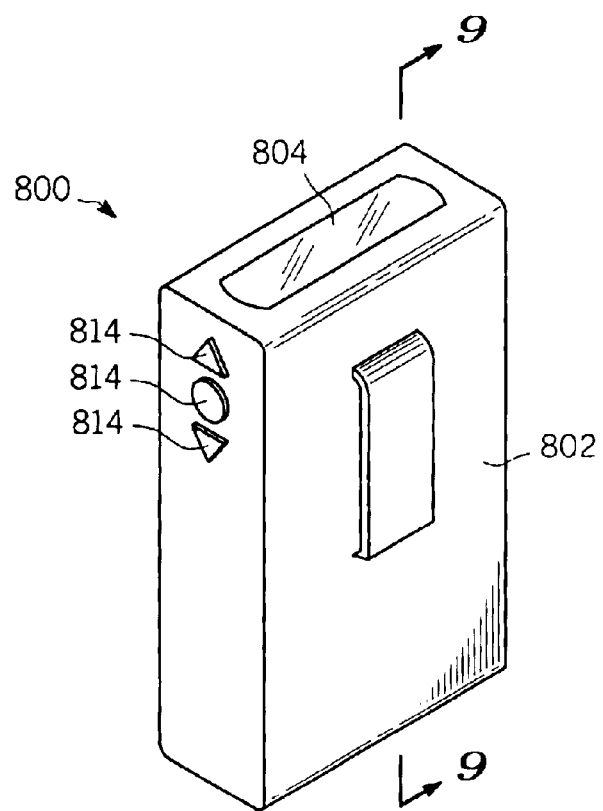
FIG. 8 is a perspective view of a wireless communication device according to a third alternative embodiment of the invention.
Figure 9:
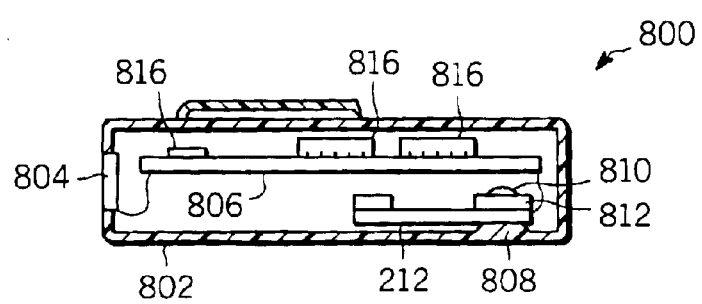
FIG. 9 is a sectional side view of the wireless communication device shown in FIG. 8.

FIG. 8 is a perspective view of a wireless communication device according to a third alternative embodiment of the invention and FIG. 9 is a sectional side view of the wireless communication device shown in FIG. 8. The wireless communication device shown in FIGS. 8 and 9 is a pager 800. The pager 800 includes a housing 802 that supports a display 804. The housing encloses a printed circuit board 806, and the electromechanical transducer 212. The printed circuit board 806 supports a number of electrical components 816. The electromechanical transducer 212 is mounted on a mounting boss 808, with one or more screws 810, and a clamping plate 812. A plurality of elastomeric buttons 814 are supported on the housing 802. The buttons 814 are used for controlling the pager 800. The elastomeric buttons 814, the electromechanical transducer 212, and the display 804 are electrically coupled to the circuit board 806.

In response to a users actuation of elastomeric buttons 814, the electromechanical transducer 212 will be driven with a signal that causes the electromechanical transducer 212 to emit mechanical energy that is coupled through the housing 802 through the elastomeric buttons 814 and into a finger of a user that is depressing one of the elastomeric buttons. Concurrently, the pager 800 will be jolted. Simultaneously, and audible clicking sound is emitted. The electromechanical transducer 212 can also be used in the pager to playback voice messages.

Figure 10:
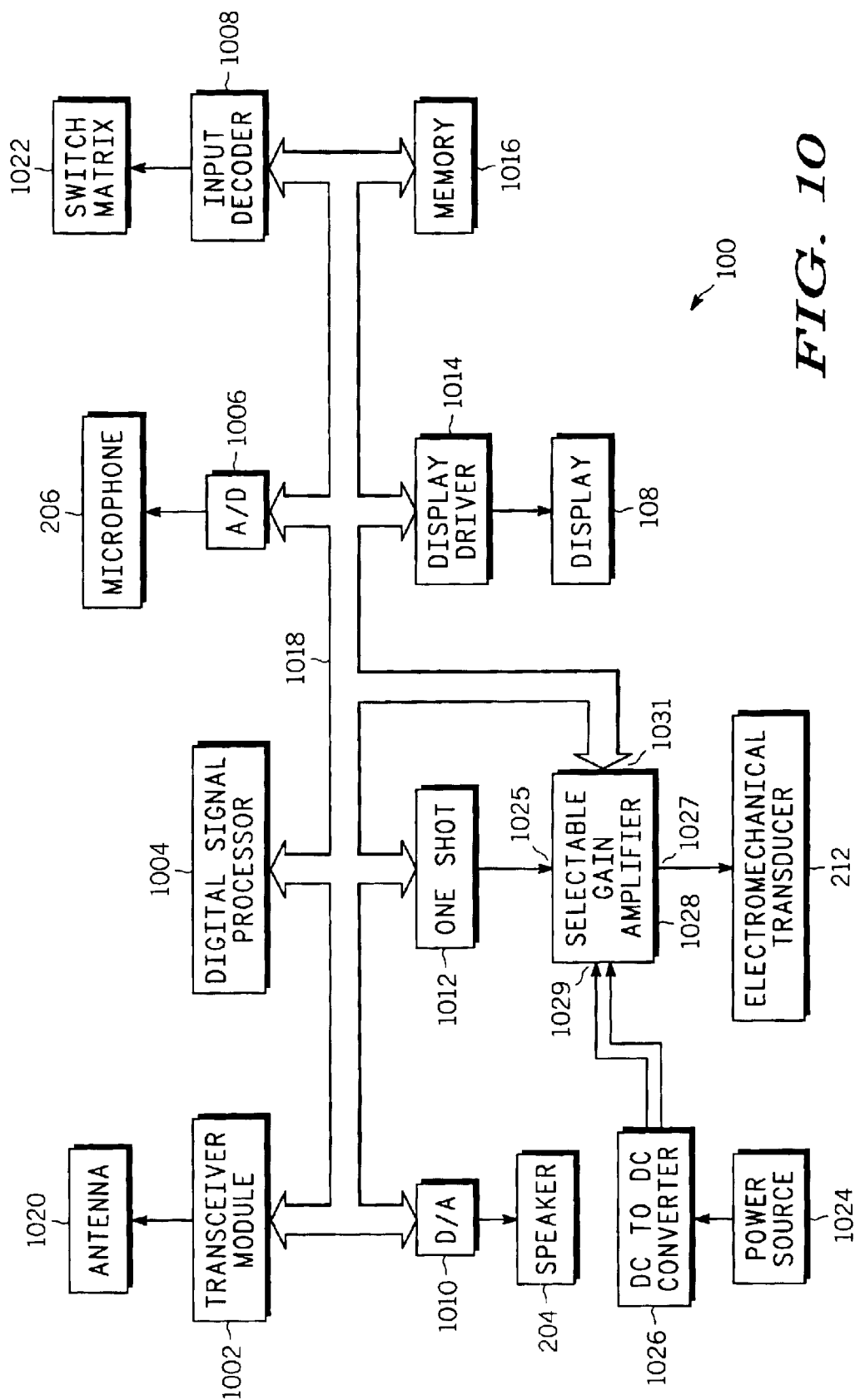
FIG. 10 is a block diagram of the wireless communication devices shown in FIGS. 1 and 2 according to the preferred embodiment of the invention.

FIG. 10 is a block diagram of the wireless communication devices shown in FIGS. 1, and 2 according to the preferred embodiment of the invention. With some deletions and alterations, some of which are mentioned below, the block diagram shown in FIG. 10 also describes the wireless communication devices shown in FIGS. 6–9.

Referring to FIG. 10, the telephone 100 comprises a transceiver module 1002, a digital signal processor (DSP) 1004, an analog-to-digital converter 1006 (A/D), an input decoder 1008, a digital-to-analog converter (D/A) 1010, a monostable multivibrator (one shot) 1012, a display driver 1014, and a memory module 1016 coupled through a digital signal bus 1018. The transceiver module 102 is coupled through an antenna 1020 to free space. The A/D 1006 is coupled to the microphone 206 for receiving audio signals therefrom. The display driver 1014 is coupled to the display 108. The D/A 1010 is coupled to the speaker 204. The speaker 204 is driven by signals output by the D/A 204. The one shot 1012 serves as a pulse generator. Other forms of pulse generator are alternatively used.

A switch matrix 1022 is coupled to the input decoder 1008. The switch matrix 1022 preferably comprises the keypad 202, and associated metallization (e.g., interdigitated fingers 308, 310) on the printed circuit board 208. The input decoder 1008 serves to identify depressed keys and supply information identifying depressed keys to the DSP 1004. The input decoder 1008 is preferably adapted to send an interrupt to the DSP 1004 in response to a key press, and thereafter to provide data identifying a depressed key. Identifying information preferably takes the form of a multibit word that is read by the DSP in a read operation that is triggered by the interrupt. Rather that using an interrupt, the DSP 1004 can be programmed to periodically read the input decoder 1008. The memory module 1016 is used to store programs that are executed by the DSP 1004 to control the operation of the telephone 100, including the reading of the input decoder 1008.

The one shot 1012 is configured to output pulses of predetermined amplitude and duration in response to receiving a trigger signal from the DSP 1004. Alternatively, other interface logic (e.g., address decoding logic) is included between the digital signal bus 1018, and the one shot 1012. The DSP 1004 is programmed to trigger the one-shot 1012 in response to a key press being communicated through the input decoder 1008. Optionally, the triggering of the one shot 1012 can selectively enabled or disabled in accordance with configuration settings that a user can edit. The one shot 1012 is coupled to a signal input 1025 of a selectable gain amplifier 1028. The pulses output by the one shot 1012 are amplified by the selectable gain amplifier 1028, and amplified versions of the pulses are output at an output 1027 of the selectable gain amplifier 1028. A power source 1024 (e.g., a battery) supplies power at a relatively low voltage (e.g., 1 to 10 volts) to a DC to DC converter 1026. The DC to DC converter 1026 is adapted to receive power at the relatively low voltage from the power source 1024 (e.g., a battery), and output power at a higher voltage e.g., in the range of 10 to 100 volts. The amplifier 1028 is powered by the output of the DC to DC converter 1026 so that the amplifier 1028 can produce high voltage amplitude signals. The amplifier 1028 includes a power supply input 1029 coupled to the DC to DC converter 1026. The amplifier 1028 includes digital gain select inputs 1031 coupled to DSP 1004 through digital signal bus 1018. A gain setting of the selectable gain amplifier 1028 can be adjusted to set the amplitude of signals used to drive the electromechanical transducer 212. Alternatively, the gain select inputs 1031 are eliminated.

The electromechanical transducer 212 is coupled to the output 1027 of the amplifier 1028. The electromechanical transducer 212 is driven by the output of the amplifier 1028.

More generally, the electromechanical transducer 212 is preferably driven by a signal that includes at least one approximation of a step function. (Note that a step function is a mathematical ideal that no real world circuit can achieve). A step function includes a broad range of frequencies. By using a driving signal that includes an approximation of a step function, the electromechanical transducer 212 is caused to emit an impulse of mechanical energy that propagates to the keypad 202 and is felt by a user operating the telephone 100, and concurrently the electromechanical transducer 212 is caused to emit an audible sound that includes frequency components of the driving signal. More preferably, the electromechanical transducer 212 is driven by a signal that includes one or more pulses. Preferably, a single pulse is generated in response to each detected key press. Using a single pulse is advantageous in that a single pulse generates an impulse of mechanical energy that creates a tactile sensation that simulates the feel of prior art keys with which user's may be familiar. Thus reduced cost keys such as elastomeric key 103 can be used while attaining improved ergonomic performance.

A broad frequency response which characterizes the preferred form of the electromechanical transducer 212 shown in FIG. 4 contributes to allowing the electromechanical transducer 212 to simultaneously emit a mechanical energy impulse that can be felt and an audible sound in response to a driving signal. The inclusion of the mass 212 also contributes to allowing the preferred form of the electromechanical transducer 212 shown in FIG. 4 to produce a sufficient mechanical energy impulse that is coupled to keypad 202 and provides tactile feedback to the user. The mass is preferably at least 0.5 grams. The use of the DC to DC converter 1014 to increase a supply voltage used to power the amplifier 1014, in combination with the use of piezoelectric layers 418, 420 to cause deflection is also useful in generating a mechanical energy impulse that is sufficient to be felt by the user. The pulses used to drive the piezoelectric layers 418, 420 of the transducer 212 are preferably at least 18 volts, and accordingly the DC to DC converter is preferably capable of supplying that voltage.

The transceiver module 1002, DSP 1004, A/D 1006, input decoder 1008, D/A 1010, one shot 1012, display driver 1014, memory 1016, DC to DC converter 1014, an amplifier 1014 are preferably part of an electric circuit that is embodied in the circuit components 210, and interconnecting traces of the circuit board 208.

Alternatively in lieu of using the one shot 1012, and the selectable gain amplifier 1014 to drive the transducer 1014 a different electric circuit is used to drive the transducer 1014 in order to generate tactile feedback.

In the PDA 600 the switch matrix 1022 takes the form of the touch screen 604. Alternatively, an acoustic, or analog type touch screen can be used. In the PDA, the decoder 1008 would be replaced by a type of decoder suitable to the type of touch screen that is used. Certain components such as the microphone 206, and speaker 204, can be absent in the case of the PDA 600.

Similarly, in the pager 800, the switch matrix would be adapted to handle the limited number of buttons 814, and certain components such as the microphone 206, and speaker 204 can be eliminated.

Figure 11:
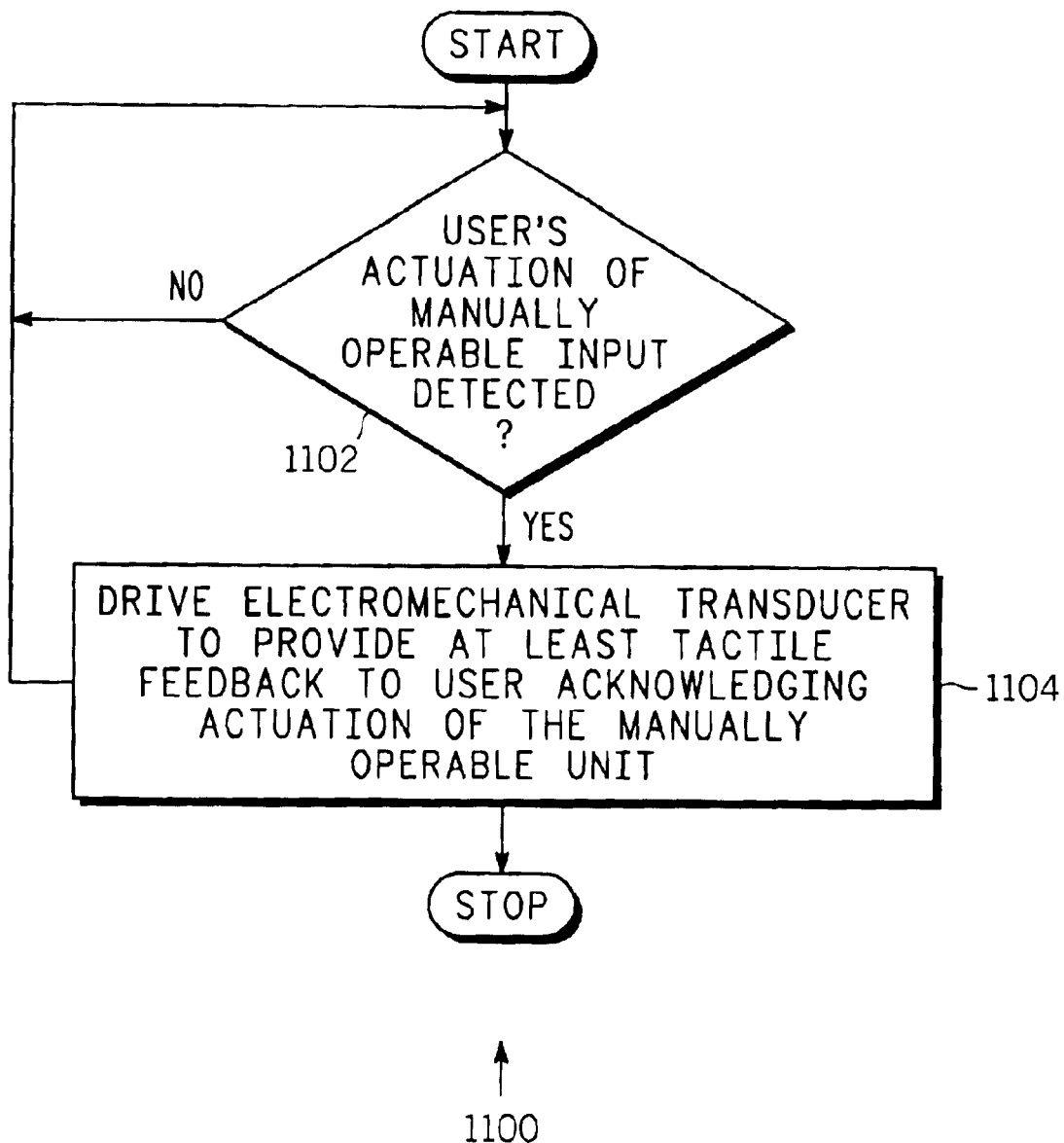
FIG. 11 is a flow diagram of a method for operating the wireless communication devices shown in FIGS. 1, 2, 6–9 according to the preferred embodiment of the invention.

FIG. 11 is a flow diagram 1100 of a method for operating the wireless communication devices shown in FIGS. 1, 2 6–9 according to the preferred embodiment of the invention. Block 1102 is a decision block that depends on whether the user's actuation of a manually operable input has been detected. If not the flow diagram 1100 continually loops back and awaits the actuation of the manually operable input. In the case of the telephone 110, the manually operable input takes the form of the keys 102, in the case of the PDA 600, the manually operable input takes the form of the touch screen 604, and in the case of the pager 800, the input takes the form elastomeric buttons 814. When actuation of the manually operable input is detected the flow diagram 1100 progresses to step 1104 in which the electromechanical transducer 212 is driven to produce, at least, tactile feedback and preferably concurrently and audible click to the user acknowledging the actuation of the manually operable input.

Figure 12:
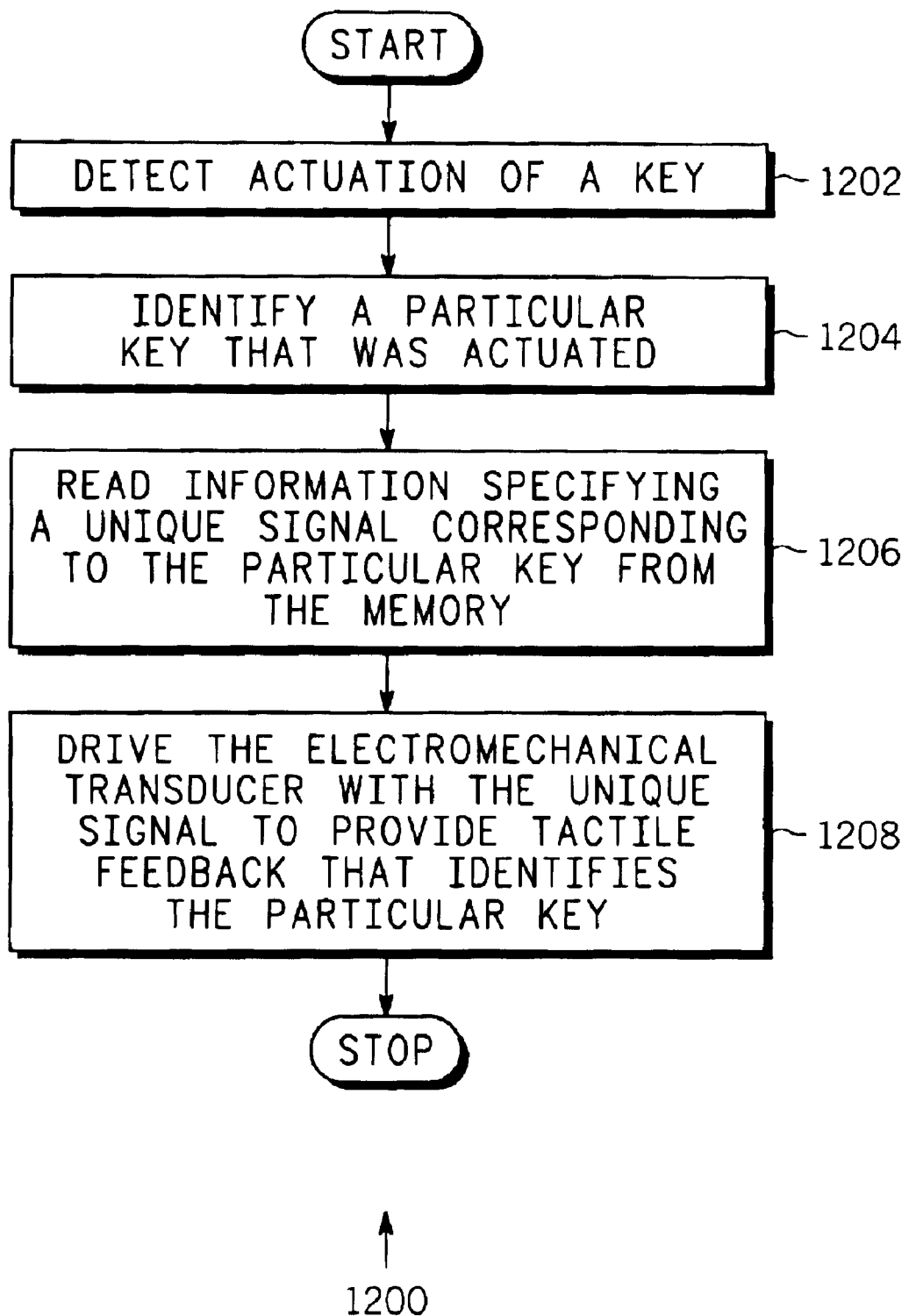
FIG. 12 is a flow diagram of a method for identifying a pressed key using tactile feedback according to an embodiment of the invention.

FIG. 12 is a flow diagram of a method for identifying a pressed key using tactile feedback according to an embodiment of the invention. In step 1202 actuation of a key is detected. Actuation of a key can be detected by the DSP 1004 by receiving an interrupt signal from the input decoder 1008. In step 1204 a particular key that was actuated is identified. The DSP 1004 can identify a particular key by reading the decoder 1008. Alternatively, the steps 1202 and 1204 can be combined. For example, the DSP 1004 can periodically read the decoder 1008. In step 1206 information specifying a unique signal corresponding to the particular key is read from the memory 1016. Alternatively, rather than read information specifying the unique signal from memory, a unique signal can be derived, e.g., by computation, from the identification of the particular key (e.g., from a binary word output by the decoder 1008). In step 1208 the electromechanical transducer 212 is driven with the unique signal to provide tactile feedback that identifies the particular key. Unique signals, used to identify actuated keys, can use a format similar to Morse code in which dashes are replaced by high amplitude mechanical energy impulses, and dots are replace by low amplitude mechanical energy impulses, or the visa versa. The amplitude of mechanical energy impulses generated by the transducer 212 is controlled through the digital gain select inputs 1031 of the selectable gain amplifier 1028. Alternative identification of keys is encoded using different length pauses between impulses, or different numbers of impulses. Other encoding systems can be used. Providing tactile feedback that identifies a depressed key is an aid, in particular, to sight impaired users.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. An electronic apparatus comprising:
    a manually operable input;
    an electromechanical transducer that is mechanically coupled to the manually operable input;
    an electric circuit that is:
        coupled to the manually operable input for detecting operation of the manually operable input;
        coupled to the electromechanical transducer for driving the electromechanical transducer; and
        adapted to drive the electromechanical transducer in response to detecting the operation of the manually operable input with a driving signal so as to cause the electromechanical transducer to generate an impulse that can be felt by a user, whereby the user receives tactile acknowledgement of successful operation of the manually operable input, and
    a transceiver.

2. The electronic apparatus according to claim 1 further comprising:
    a housing, wherein:
        the manually operable input is mechanically coupled to the housing; and
        the electromechanical transducer is mechanically coupled to the housing.

3. The electronic apparatus according to claim 1 wherein:
    the manually operable input comprises an elastomeric switch.

4. The electronic apparatus according to claim 1 wherein the electromechanical transducer comprises;
    a piezoelectric motor.

5. The electronic apparatus according to claim 1 wherein the electric circuit is adapted to drive the electromechanical transducer with a waveform that includes at least one approximation of a step function.

6. The electronic apparatus according to claim 1 wherein the electric circuit comprises:

a pulse generator for driving the electromechanical transducer with an electrical waveform that includes a pulse.

7. An electronic apparatus comprising:
a manually operable input including a touch screen;
an electromechanical transducer that is mechanically coupled to the manually operable input;
an electric circuit that is:
  coupled to the manually operable input for detecting operation of the manually operable input;
  coupled to the electromechanical transducer for driving the electromechanical transducer; and
  adapted to drive the electromechanical transducer in response to detecting the operation of the manually operable input with a driving signal so as to cause the electromechanical transducer to generate an impulse that can be felt by a user, whereby the user receives tactile acknowledgement of successful operation of the manually operable input.

8. An electronic apparatus comprising:
a manually operable input;
an electromechanical transducer that is mechanically coupled to the manually operable input, wherein the electromechanical transducer comprises:
  a flat beam shaped piezoelectric motor including:
    a first end adapted for clamping to a support;
    a second free end;
    a first planar electrode;
    a second planar electrode; a first piezoelectric laminate disposed between the first planar electrode and the second planar electrode;
    a second piezoelectric laminate disposed between the first planar electrode and the second planar electrode;
    a third planar electrode disposed between the first piezoelectric laminate and the second piezoelectric laminate;
    a first electrical terminal disposed proximate the first end, and electrically coupled to the first and second planar electrodes;
    a second electrical terminal disposed proximate the first end, and electrically coupled to the third planar electrode; and
  a mass affixed to the second free end of the flat plate shaped piezoelectric motor; and
an electric circuit that is:
  coupled to the manually operable input for detecting operation of the manually operable input;
  coupled to the electromechanical transducer for driving the electromechanical transducer; and
  adapted to drive the electromechanical transducer in response to detecting the operation of the manually operable input with a driving signal so as to cause the electromechanical transducer to generate an impulse that can be felt by a user, whereby the user receives tactile acknowledgement of successful operation of the manually operable input.

9. The electronic apparatus according to claim 8 wherein the mass is at least 0.5 grams.

10. An electronic apparatus comprising:
a manually operable input;
an electromechanical transducer that is mechanically coupled to the manually operable input;
an electric circuit that is:
  coupled to the manually operable input for detecting operation of the manually operable input;
  coupled to the electromechanical transducer for driving the electromechanical transducer; and
  adapted to drive the electromechanical transducer in response to detecting the operation of the manually operable input with a driving signal so as to cause the electromechanical transducer to generate an impulse that can be felt by a user, whereby the user receives tactile acknowledgement of successful operation of the manually operable input; and
wherein the electric circuit comprises:
  a pulse generator for driving the electromechanical transducer with an electrical waveform that includes a pulse;
  a DC to DC converter adapted to receive power from a first power source that is characterized by a first voltage, and output power characterized by a second voltage that exceeds the first voltage;
  an amplifier that includes:
    a supply voltage input coupled to the DC to DC converter for receiving power characterized by the second voltage;
    a signal input coupled to the pulse generator; and
    an amplified signal output coupled to the electromechanical transducer.

11. The electronic apparatus according to claim 10 wherein the amplifier is adapted to output a pulse having an amplitude of at least 18 volts.

12. A method of operating an electronic apparatus that includes a plurality of manually operable inputs including the steps of:
detecting a user's actuation of a manually operable input; and
in response to detecting the user's actuation of the manually operable input, driving an electromechanical transducer, which is not uniquely associated with any one of the manually operable inputs to supply tactile feedback to the user.

13. The method according to claim 12 wherein the step of actuating the electromechanical transducer includes the sub-step of:
driving a piezoelectric motor with a signal having an amplitude of at least 18 volts.

14. The method according to claim 12
wherein detecting a user's actuation of a manually operable input includes identifying the particular manual input that was actuated; and
wherein driving an electromechanical transducer to supply tactile feedback to the user includes driving the electromechanical transducer with a signal to provide tactile feedback that identifies the particular manual input.

15. The method according to claim 14 wherein the step of identifying the particular manual input includes the sub-step of:
identifying a particular key that was actuated.

16. The method according to claim 14 further comprising the step of:
reading information specifying the signal from a memory.

17. A method of operating an electronic apparatus including the steps of:
detecting a user's actuation of a manually operable input including the detection of the actuation of a touch screen; and
in response to detecting the user's actuation of the manually operable input, driving an electromechanical transducer to supply tactile feedback to the user.

* * * * *